(12) United States Patent
Mair et al.

(10) Patent No.: US 7,142,019 B2
(45) Date of Patent: Nov. 28, 2006

(54) SYSTEM AND METHOD FOR REDUCING POWER-ON TRANSIENT CURRENT MAGNITUDE

(75) Inventors: Hugh T. Mair, Fairview, TX (US); Rolf Lagerquist, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 10/933,550

(22) Filed: Sep. 3, 2004

(65) Prior Publication Data

US 2006/0049849 A1 Mar. 9, 2006

(51) Int. Cl.
*H03K 19/096* (2006.01)

(52) U.S. Cl. .......................................... 326/96; 326/33
(58) Field of Classification Search .................. 326/31, 326/33, 96–97
See application file for complete search history.

(56) References Cited

U.S. PATENT DOCUMENTS 5,926,430 A * 7/1999 Noda et al. ................. 365/226
6,836,179 B1 * 12/2004 Mizuno et al. ............. 327/544
6,946,901 B1 * 9/2005 Kang et al. ................. 327/544

OTHER PUBLICATIONS

U.S. Appl. No. 10/916,135, fileds Aug. 11, 2004, Mair et al.
U.S. Appl. No. 10/918,869, Aug. 16, 2004, Dong et al.

* cited by examiner

*Primary Examiner*—James H. Cho
(74) *Attorney, Agent, or Firm*—Ronald O. Neerings; W. James Brady, III; Frederdick J. Telecky, Jr.

(57) ABSTRACT

System and method for reducing power-on transient current magnitude on distributed header switches. A preferred embodiment comprises a distributed header switch coupling a circuit to a power supply, the distributed header switch comprising a linear sequence of combination switches, each combination switches containing a pre-charge switch and a header switch. A first-pass involves sequentially turning on each of the pre-charge switches, which enables a voltage level at the distributed header switch to approach that of a final voltage level and a second-pass involves sequentially turning on each of the header switches. Since the voltage level at the distributed header switches is close to the final voltage level, a resulting transient current is small in magnitude.

27 Claims, 6 Drawing Sheets

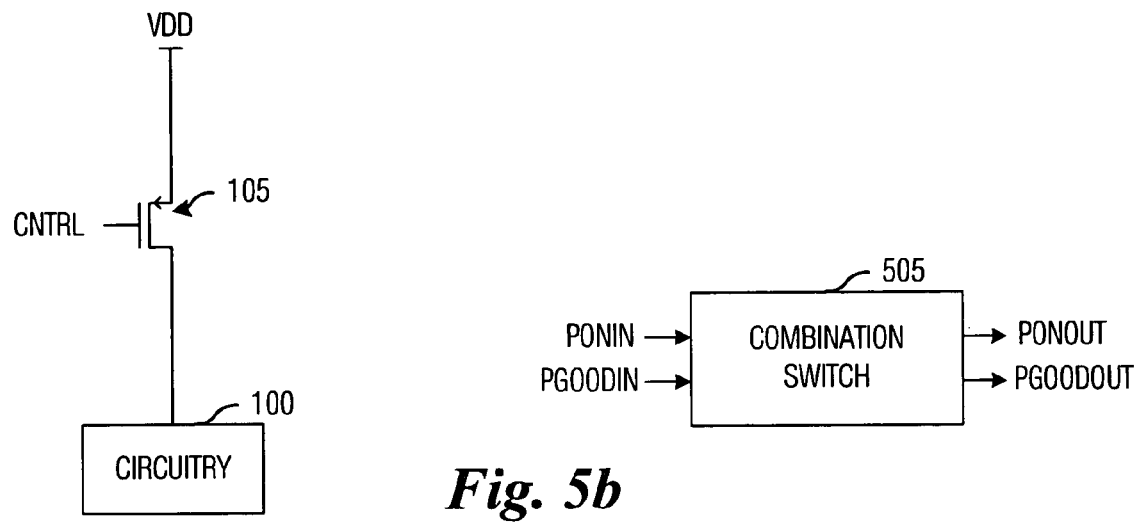
Fig. 5b
Fig. 1
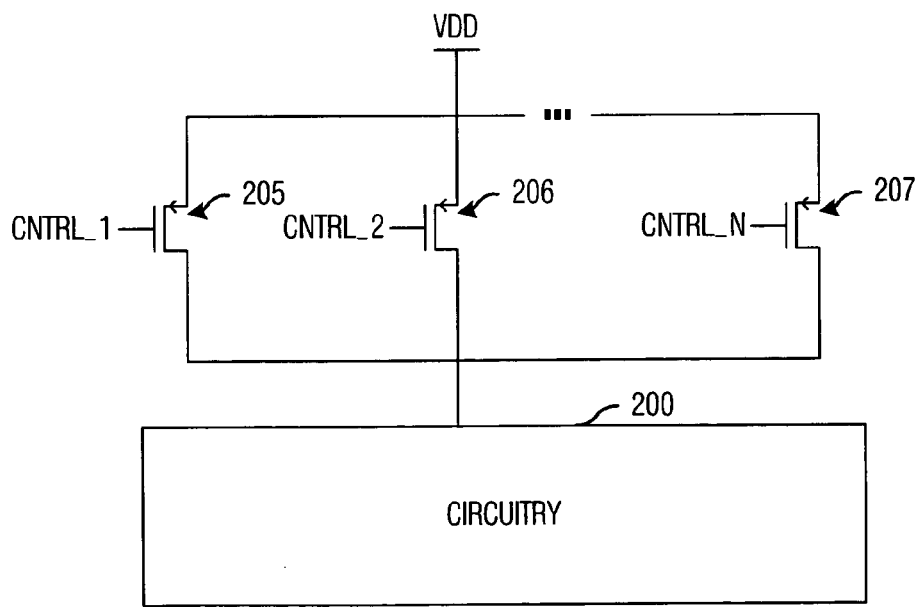
Fig. 2
(Prior Art)

SYSTEM AND METHOD FOR REDUCING POWER-ON TRANSIENT CURRENT MAGNITUDE

TECHNICAL FIELD

The present invention relates generally to a system and method for integrated circuits, and more particularly to a system and method for reducing power-on transient current magnitude on distributed header switches.

BACKGROUND

Providing power to circuitry in an integrated circuit can be a difficult proposition, especially during power-on (turn on) and power-off (turn off). An integrated header switch is typically used to couple a power supply to the circuitry. To minimize voltage drop across the integrated header switch, the integrated header switch's internal resistance is minimized. However, with a small internal resistance, when the integrated header switch is initially turned on to couple the power supply to the circuitry, a transient current with a large magnitude can result. Damage to the circuitry can result if the magnitude of the transient current is too large. Furthermore, to help ensure chip-level reliability, it is important to ensure that the maximum current draw from the power supply does not exceed normal operating current.

A prior art technique uses multiple switches in an integrated header switch and then turns on each one of the multiple switches sequentially, with a delay between consecutive switches, to help prevent large current spikes. The integrated header switch using multiple switches can be referred to as a distributed header switch. Typically, each of the multiple switches is smaller than the single integrated header switch and therefore, the magnitude of the transient current is smaller when a switch is turned on. Additionally, with a delay between consecutive switches being turned on, the transient current is spread out over time. This can also help to reduce the severity of the transient current.

Another prior art technique makes use of switches with slow gate transitions to prevent large current spikes. The slow gate transitions can effectively reduce the power ramp-up across the switch, thereby reducing the abruptness and the magnitude of the transient current.

One disadvantage of the prior art is that even with smaller transistors being used in the distributed header switches, as each switch is being turned on, a transient current of significant magnitude can still occur. Therefore, with the use of multiple switches, a sequence of transient currents can be produced, each having a magnitude that can be large enough to cause damage.

A second disadvantage of the prior art is that since each of the transient currents produced when a smaller switch is turned on may still exceed the normal operating current, each one of the smaller switches can be replaced with multiple switches that are even smaller. However, due to the delay between turning on consecutive switches, the total amount of time required to provide power to the circuitry can be very long.

Another disadvantage of the prior art is that the use of switches with slow gate transitions is that the design of these switches is essentially an analog design task. This does not scale well to a digital design environment with automatic cell routing and placement, making the design of the integrated header switch more difficult and expensive. Furthermore, changes to the design of the integrated header switch can take longer and may require a substantial re-design of the integrated header switch.

SUMMARY OF THE INVENTION

These and other problems are generally solved or circumvented, and technical advantages are generally achieved, by preferred embodiments of the present invention which provides for a system and method for reducing power-on transient current magnitude in integrated header switches.

In accordance with a preferred embodiment of the present invention, a combination switch comprising a pre-charge switch having a first source/drain terminal coupled to a power supply and a second source/drain terminal coupled to a power output terminal, wherein the pre-charge switch is configured to selectively couple the power supply to the power output terminal and a header switch having a first source/drain terminal coupled to the power supply and a second source/drain terminal coupled to the power output terminal, wherein the header switch is configured to selectively couple the power supply to the power output terminal is provided. The combination switch further comprises a first control signal line coupled to a gate terminal of the pre-charge switch, the first control signal line configured to carry a first control signal to control a state of the pre-charge switch and second control signal line coupled to a gate terminal of the header switch, the second control signal configured line to carry a second control signal to control a state of the header switch. The pre-charge switch is turned on before the header switch, and has a lower current capacity than the header switch.

In accordance with another preferred embodiment of the present invention, a distributed switch comprising a linear sequence of combination switches is provided. Each combination switch comprises a pre-charge switch having a first source/drain terminal coupled to a power supply and a second source/drain terminal coupled to a power output terminal, wherein the pre-charge switch is configured to selectively couple the power supply to the power output terminal and a header switch having a first source/drain terminal coupled to the power supply and a second source/drain terminal coupled to the power output terminal, wherein the header switch is configured to selectively couple the power supply to the power output terminal. Each combination switch further comprises a first control signal line coupled to a gate terminal of the pre-charge switch, the first control signal line configured to carry a first control signal to control a state of the pre-charge switch, wherein the first control signal line of a combination switch is coupled to the first control signal line of a combination switch immediately preceding it in the linear sequence and the first control signal line of a combination switch is coupled to the first control signal line of a combination switch immediately following it in the linear sequence and a second control signal line coupled to a gate terminal of the header switch, the second control signal line configured to carry a second control signal to control a state of the header switch, wherein the second control signal line of a combination switch is coupled to the second control signal line of a combination switch immediately preceding it in the linear sequence and the second control signal line of a combination switch is coupled to the second control signal line of a combination switch immediately following it in the linear sequence.

In accordance with another preferred embodiment of the present invention, a method for providing power to circuitry in an integrated circuit with minimal power-on transient current is provided. The method comprises turning on a series of low-current switches in a sequential fashion, wherein each low-current switch couples the circuitry to a power supply and each low-current switch is a transistor with a first size, and turning on a series of high-current switches in a sequential fashion, wherein each high-current switch couples the circuitry to the power supply and each high-current switch is a transistor with a second size, wherein the second size is larger than the first size, and wherein a number of low-current switches is equal to a number of high-current switches.

An advantage of a preferred embodiment of the present invention is that a large number of small switches can operate in conjunction to spread out the power-up sequence over an extended period of time.

A further advantage of a preferred embodiment of the present invention is that the use of a large number of small switches can result in the distribution of the switches (current sources) over a wider area of the integrated circuit. This can result in a power-up that is more evenly distributed throughout the integrated circuit.

Yet another advantage of a preferred embodiment of the present invention is that the use of the large number of small switches can result in a shorter turn-on time since a delay associated with each small switch can be significantly smaller than a delay associated with a larger switch.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is an arrangement for providing power to circuitry in an integrated circuit through the use of a transistor;

FIG. 2 is a prior art switch arrangement for providing power to circuitry in an integrated circuit with a reduced power-on transient current;

FIGS. 5a through 5c are diagrams of a distributed header switch with a linear sequence of combination switches, according to a preferred embodiment of the present invention;

DETAILED DESCRIPTION OF ILLUSTRATIVE EMBODIMENTS

Figure 3:
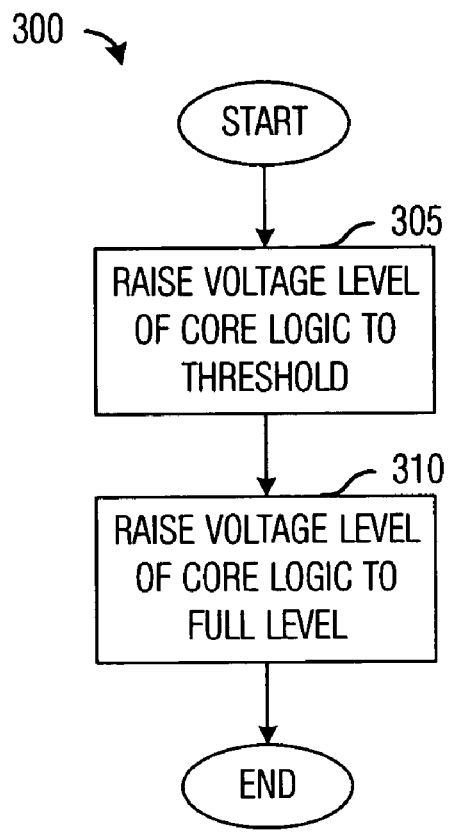
FIG. 3 is a flow diagram of a sequence of events for providing power to a circuit in an integrated circuit without causing a transient current with a large magnitude, according to a preferred embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a distributed header switch for providing power to logic circuitry in an integrated circuit, such as in a system-on-a-chip (SOC) application, wherein there is a need to provide power to different regions of the integrated circuit with potentially different power requirements at the different regions. The invention may also be applied, however, to other power supply applications, wherein there is an interest in reducing power-on transient currents and minimizing power-on time.

With reference now to FIG. 1, there is shown a diagram illustrating an arrangement for providing power to circuitry 100 in an integrated circuit through the use of a transistor 105. The transistor 105 is coupled to a voltage supply "VDD" and the circuitry 100. A control signal "CNTRL" coupled to a gate terminal of the transistor 105 can control the state of the transistor 105. For example, depending upon the value of a signal on the control signal "CNTRL," the transistor 105 can either be open (non-conducting) or closed (conducting). When the transistor 105 is open, the circuitry 100 is not coupled to the voltage supply "VDD" and power is not provided to the circuitry 100. When the transistor 105 is closed, the circuit 100 is coupled to the voltage supply "VDD" and power is provided to the circuitry 100.

The arrangement shown in FIG. 1 is commonly referred to as a header configuration and the transistor 105 is commonly referred to as a header switch. Preferably, a p-type metal oxide semiconductor (PMOS) transistor is used for a header switch. In order to provide sufficient current when closed and to minimize leakage current when open, a transistor with sufficient geometry (size) is normally used.

When the control signal "CNTRL" causes the transistor 105 to close, a voltage difference seen at the different terminals of the transistor 105 can create a large transient current to flow through the transistor 105 and to the circuitry 100. A cause of this large current is the low series resistance of the switch, which is designed to have a small internal resistance drop in the operating mode, typically equal to 1% of the supply voltage; when the full supply voltage is initially placed across the switch, the current can be 100 times the normal operating current. If the transient current is of sufficient magnitude, problems can result in the circuitry 100, including possible damage to delicate transistors in the circuitry 100.

With reference now to FIG. 2, there is shown a diagram illustrating a prior art switch arrangement for providing power to circuitry in an integrated circuit with a reduced power-on transient current. As discussed previously, the use of a single switch to couple circuitry to a voltage supply can result in a large power-on transient current that can be damaging to the circuit. FIG. 2 displays one possible rearrangement of the switch to help reduce the power-on transient current. Instead of a single switch, circuitry 200 in an integrated circuit can be coupled to a voltage supply "VDD" via a plurality of switches, such as switches 205, 206, and 207. Each of the switches can be controlled by a separate control signal. For example, switch 205 can be controlled by a control signal "CNTRL_1," switch 206 can be controlled by a control signal "CNTRL_2," and switch 207 can be controlled by a control signal "CNTRL_N." Note that each one of the switches, such as switch 205, should be smaller than the single switch, transistor 105 (as shown in FIG. 1).

When power is to be provided to the circuitry 200, each one of the switches can be turned into a closed state to couple the circuitry 200 to the voltage supply "VDD." Note that each of the switches is turned into the closed state individually and that there is a delay between the closing of one switch and the closing of a subsequent switch. For example, the switch 205 may be the first switch to be closed and then after a delay, the switch 206 can be closed, and so forth. The sequential closing of the plurality of switches instead of the closing of the single switch can effectively reduce the magnitude of the power-on transient current as well as spread the power ramp-up over a period of time. The switches are shown to be coupled to a common power rail and the circuitry 200. However, it may be possible that each of the switches may be coupled to a different power rail and to a different portion of the overall circuitry 200.

Although the use of multiple switches in place of a single switch can reduce the power-on transient current by spreading it out over a period of time, it may still be possible to have transient currents of significant magnitude when each one of the switches are closed. Furthermore, as each of the switches are being closed and the power being provided to the circuitry 200 approaches the desired value, the delay in the power ramp-up remains substantially constant and therefore can cause a delay in the power ramp-up. This can result in a delay in the amount of time that it takes to reach the desired power for the circuitry 200, delaying the commencement of operations for the circuitry 200.

Rather than turning on a switch (or a plurality of switches) that couples circuitry to the power supply in a single-pass approach as described in FIGS. 1 and 2, a preferred embodiment of the present invention takes a two-pass approach when coupling circuitry to a power supply. A first pass in the two-pass approach can entail bringing the circuitry to a voltage level that is sufficiently close to the voltage level of the power supply, while a second pass brings the circuit to the voltage level of the power supply. By placing a voltage level that is close to the voltage level of the power supply, when the circuit is finally brought to the voltage level of the power supply, a transient current with a large magnitude can be avoided.

With reference now to FIG. 3, there is shown a flow diagram illustrating a sequence of events 300 in providing power to a circuit in an integrated circuit without causing a transient current with a large magnitude, according to a preferred embodiment of the present invention. As discussed previously, a two-pass approach can be taken to ensure that a damaging transient current does not occur. A first pass involves raising a voltage level of the circuitry to a level that is substantially equal to a specified threshold (block 305). The specified threshold can be set so that when the circuitry is raised to the final voltage level (the voltage level of the voltage supply), a resulting transient current has a sufficiently small magnitude so that it does not cause any damage to the circuitry. Additionally, to help ensure chip-level reliability, the transient current should have a magnitude that is less than or equal to the normal operating current.

Once the voltage level at the circuitry has been raised to a level that is substantially equal to that of the specified threshold, then the voltage level of the circuitry can be raised to the voltage level of the voltage supply (block 310). Since a difference between the voltage level that is substantially equal to the threshold and the voltage level of the voltage supply is small, the resulting transient current will have a relatively small magnitude, even when the minimal resistance of the switches being used to couple the circuitry to the power supply is considered.

Figure 4:
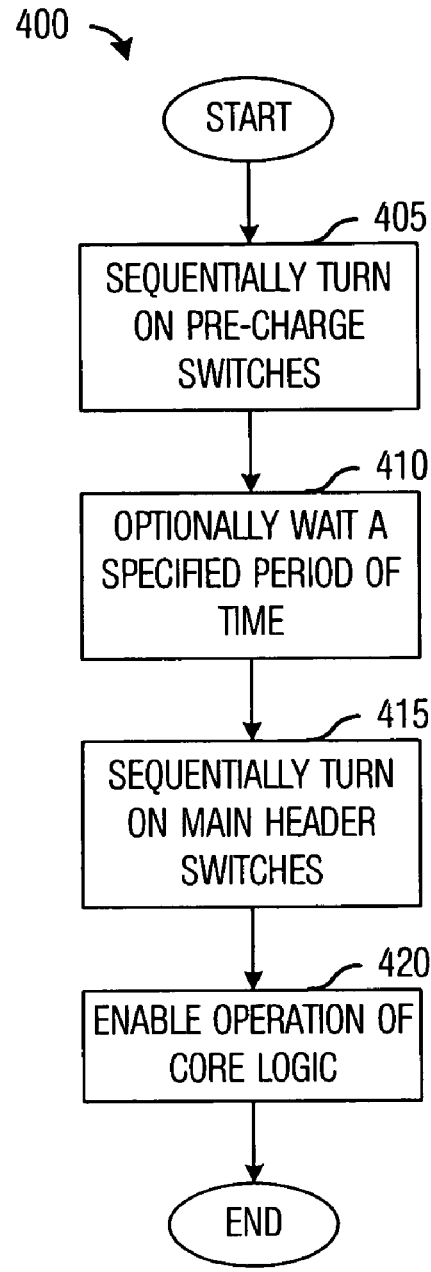
FIG. 4 is a flow diagram of a control algorithm for providing power to a circuit in an integrated circuit without causing a transient current with a large magnitude, according to a preferred embodiment of the present invention.

With reference now to FIG. 4, there is shown a flow diagram illustrating a control algorithm 400 for providing power to a circuit in an integrated circuit without causing a transient current with a large magnitude, according to a preferred embodiment of the present invention. The control algorithm 400 can be an implementation of a two-pass approach for providing power to circuitry and can make use of a combination switch structure to provide the power to the circuitry without inducing a transient current with a large magnitude. The combination switch structure includes a pre-charge switch and a header switch coupled in parallel. The pre-charge switch and the header switch are preferably made from PMOS transistors, with the pre-charge switch being significantly smaller than the header switch. A plurality of these combination switches can be coupled serially into a distributed header switch. A detailed description of the combination switch structure and its use is provided below.

The control algorithm 400 can be implemented in a custom designed logic block and can be used to control the coupling of the circuitry to a power supply. The control algorithm 400 may be a portion of a power-up sequence that is used to control the power-on sequence for an integrated circuit or a group of integrated circuits. For example, the power-up sequence can be implemented as a logic block that, upon application of power, begins execution to ensure that the remainder of the integrated circuit is powered up in a proper order to prevent damage to the integrated circuit and to initialize the integrated circuit to a correct state for operation.

The control algorithm 400 can begin by sequentially turning on the pre-charge switches in the combination switches (block 405). The pre-charge switches are small and combined with the fact that they are being turned on sequentially with a delay between each pre-charge switch being turned on, the voltage at the circuitry slowly rises without resulting in a damaging transient current. As the pre-charge switches are being turned on, a current seen across the distributed header switch also rises. However, after all of the pre-charge switches have been turned on and as the voltage level seen at the circuitry begins to approach that of the power supply, the current across the distributed header switch begins to drop.

After the control algorithm 400 has completed turning on all of the pre-charge switches (block 405), the control algorithm 400 may optionally implement a delay (block 410). The delay may be used to permit the current sufficient time to peak and then drop. The delay can be useful in situations wherein the distributed header switch has an insufficient number of pre-charge switches, for example.

When the distributed header switch has an insufficient number of pre-charge switches to permit the voltage at the circuitry to approach that of the threshold, then a transient current with a damaging magnitude may still arise when the header switches are closed since there may still be a sufficiently large voltage difference between the voltage level of the circuitry and the voltage level of the power supply. The delay can help to alleviate that difference by providing sufficient time to help reduce the voltage difference.

After the control algorithm 400 has completed turning on all of the pre-charge switches (block 405) or after the completion of the delay (block 410), the control algorithm 400 can begin to sequentially turn on the header switches (block 415). As discussed previously, the header switches are significantly larger than the pre-charge switches and are the main conduits for power provided by the power supply to the circuitry. According to a preferred embodiment of the present invention, the header switches are turned on sequentially, one at a time, with a small delay between each switch being turned on, to help reduce the probability of a transient current with a large magnitude. By sequentially turning on the header switches, the control algorithm 400 can effectively spread out the transient current over a period of time and reducing the overall magnitude of the transient current by slowly increasing the available current paths (the header switches). Once all of the header switches have been turned on, the circuitry may be ready to begin operations. For example, the control algorithm 400 can permit the commencement of operations by the circuitry by enabling a clock signal (block 420).

Figure 5A:
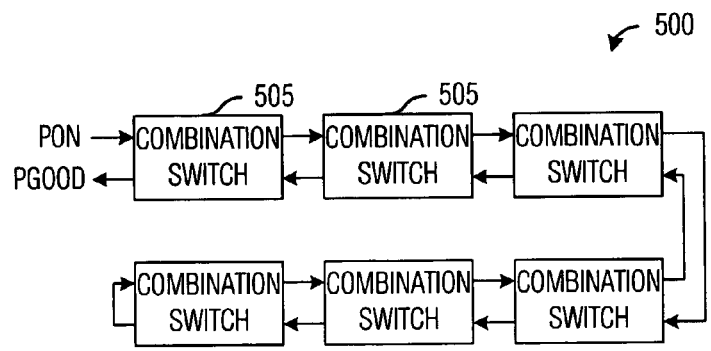
Figure 5C:
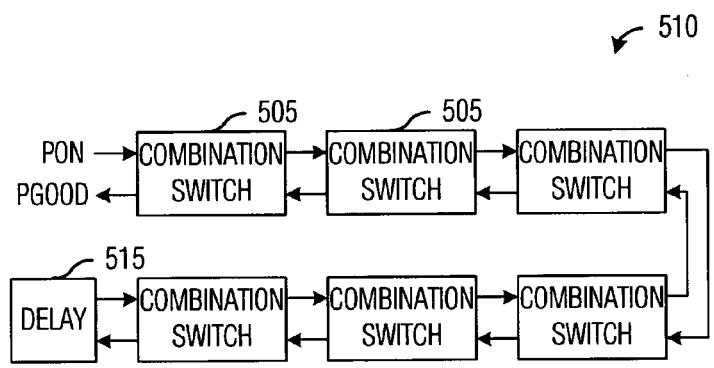

With reference now to FIGS. 5a through 5c, there are shown diagrams illustrating a detailed view of a distributed header switch 500 and a detailed view of a combination switch 505, according to a preferred embodiment of the present invention. The distributed switch 500 can be made from a linear sequence of combination switches 505. The number of combination switches 505 arranged in a linear sequence in the distributed switch 500 can be dependent upon the amount of current that is to be provided to the circuitry, the voltage level of the power supply, and so forth. For example, to be able to provide a large amount of current, a large number of combination switches 505 may be needed. Additionally, if the voltage level being provided by the power supply is large, then a large number of combination switches 505 may again be needed. It can be possible to obtain an estimate of the number of combination switches 505 needed in the distributed switch 500. First, obtain an estimate of the capacitive load of the circuitry and the amount of capacitance that each pre-charge switch can drive. Then, an estimate of the number of combination switches 505 can then be determined by dividing the capacitive load by the amount of capacitance that each pre-charge switch can drive. Whether a large number or a small number of combination switches 505 is needed, the distributed switch 500 can be made out of a linear arrangement of the combination switches 505. If more combination switches 505 are needed due to a design change, then the distributed switch 500 can be readily modified by making the linear arrangement longer. Similarly, the distributed switch 500 can be readily shortened if fewer combination switches 505 are needed. While modifications to the distributed switch 500 would require the generation of a new fabrication layout, the distributed switch 500 would not need to be redesigned since it can be readily scaled to meet changing needs by increasing or decreasing the number of combination switches 505.

With reference to FIG. 5b, each combination switch can have a pair of control signal inputs and a pair of control signal outputs. A first control signal input "PONIN" represents a first control signal that can be used to turn on a pre-charge switch located in the combination switch 505, while a first control signal output "PONOUT" represents a continuation of the first control signal and is used to provide the first control signal to a subsequent combination switch. A second control signal input "PGOODIN" represents a second control signal that can be used to indicate that all pre-charge switches in the distributed header switch 500 have been turned on and to turn on a header switch located in the combination switch 505, while a second control signal output "PGOODOUT" represents a continuation of the second control signal and is used to provide the second control signal to a subsequent combination switch.

At a first combination switch in the distributed switch 500, the first control signal input can be assigned a special name "PON" and can be used to initiate the power on sequence for the distributed switch 500. For example, the control algorithm 400 (FIG. 4) can assert the first control signal input at the first combination switch in the distributed switch 500. Furthermore, the second control signal output at the first combination switch in the distributed switch 500 can also be assigned a special name "PGOOD" and can be used to indicate that the distributed switch 500 has been turned on and power is being provided to the circuitry. For example, the control algorithm 400 can permit the commencement of operations in the circuitry, upon detection of an asserted "PGOOD" control signal.

With reference to FIG. 5c, the distributed switch 510 includes a delay element 515 coupled to a final combination switch in a linear sequence of combination switches 505. As discussed previously, the delay element 515 can be used to permit a voltage level at the circuitry to reach a threshold, thereby resulting in a reduction in a current flowing across the distributed switch 510, prior to the header switches in the combination switches 505 being closed. The use of the delay element 515 permits the use of fewer combination switches 505 in a design. The amount of delay imparted by the delay element 515 can be dependent upon the number of combination switches 505 used in the distributed switch 510, the voltage potential being provided by the power supply, a capacitance of a load being driven by the distributed switch 510, and so forth.

Figure 6:
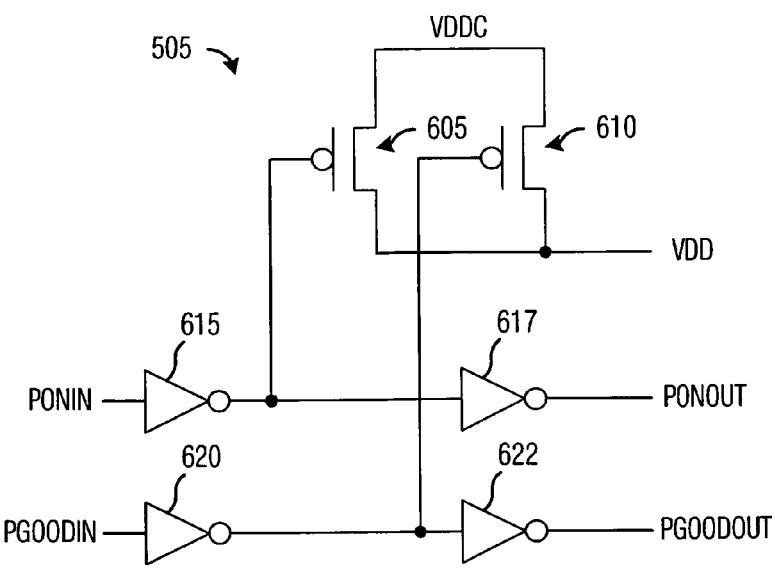
FIG. 6 is a diagram of a detailed view of a combination switch, according to a preferred embodiment of the present invention.

With reference now to FIG. 6, there is shown a diagram illustrating a detailed view of a combination switch 505, according to a preferred embodiment of the present invention. As discussed previously, the combination switch 505 includes a pre-charge switch 605 and a header switch 610. According to a preferred embodiment of the present invention, both the pre-charge switch 605 and the header switch 610 can be made from PMOS transistors. However, the pre-charge switch 605 is preferably made from a transistor that is significantly smaller than a transistor used to make the header switch 610, due to differences in the amount of current that the two switches have to provide. Furthermore, while the pre-charge switch 605 and the header switch 610 are shown in FIG. 6 as single PMOS transistors, it may be necessary to create each of them out of a plurality of PMOS transistors arranged in a parallel fashion. This may be due to fabrication restrictions on a maximum size transistor that can be fabricated or the aspect ratio of the individual PMOS transistors. Note that the use of multiple transistors to create a single transistor with a larger effective size is more likely to occur for the case of the header switch 610 than for the pre-charge switch 605 due to the header switch's considerably larger size.

The pre-charge switch 605 and the header switch 610, arranged in parallel, can have their first source/drain terminals coupled to a power supply "VDDC" and second source/drain terminals that can be coupled to circuitry (or to a power rail that is coupled to the circuitry). The second source/drain terminal provides a core logic voltage level to the circuitry and can be labeled "VDD."

The pre-charge switch 605 has a gate terminal that can be coupled to a first control signal input "PONIN" and a first control signal output "PONOUT" and the header switch 610 has a gate terminal that can be coupled to a second control signal input "PGOODIN" and a second control signal output "PGOODOUT." A description of the function of the first and second control signal inputs and outputs was provided above. According to a preferred embodiment of the present invention, the gate terminal of the pre-charge switch 605 and the gate terminal of the header switch 610 are not directly coupled to the first control signal input "PONIN" and the second control signal input "PGOODIN." Rather, the first control signal input "PONIN" can first be provided to an inverting buffer 615 prior to being coupled to the gate terminal of the pre-charge switch 605. Similarly, the second control signal input "PGOODIN" can first be provided to an inverting buffer 620 prior to being coupled to the gate terminal of the header switch 610.

Outputs of the inverting buffers 615 and 620 can then be provided to a second set of inverting buffers (inverting buffer 617 and 622) to restore a proper polarity to the first control signal input "PONIN" and the second control signal input "PGOODIN" prior to their being sent out the first control signal output "PONOUT" and the second control signal output "PGOODOUT" respectively. The inverting buffers 615 and 620 can be used not only for ensuring that a signal of proper polarity is present at the gate terminals of the pre-charge switch 605 and the header switch 610 to turn on the transistors, but the inverting buffers 615 and 620 (as well as the inverting buffers 617 and 622) can impart a propagation delay that can be used to insert a delay between the turning on of consecutive switches. As shown in FIG. 6, there can be a delay substantially equal to two times the propagation delay of a single inverting buffer between the turning on of one switch and the turning on of a consecutive switch. It can then be possible to design the inverting buffers 615, 617, 620, and 622 to change the amount of delay occurring between the turning on of consecutive switches. Additionally, inverting buffers can be added (or removed) to affect a greater change on the delay. Furthermore, the delay between turning on consecutive pre-charge switches can be different from the delay between turning on consecutive header switches.

Figure 7:
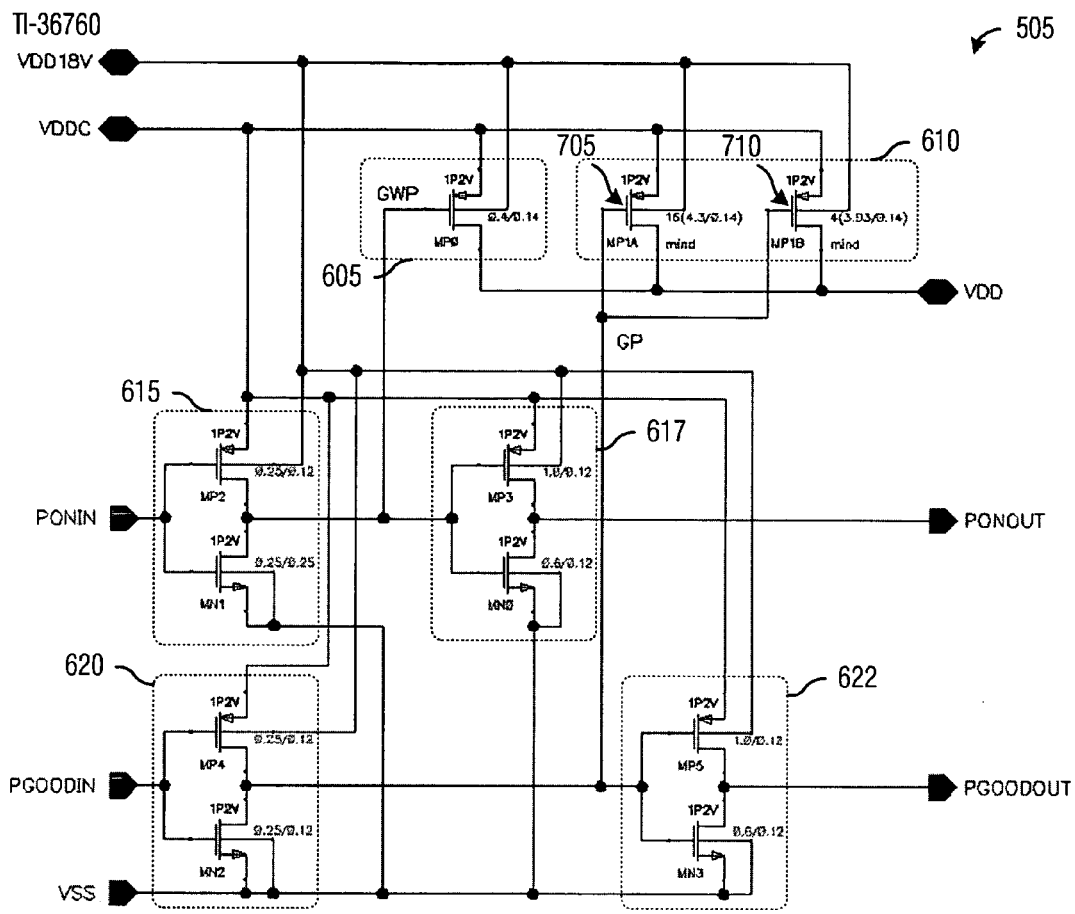
FIG. 7 is a diagram of a schematic of an exemplary implementation of a combination switch, according to a preferred embodiment of the present invention.

With reference now to FIG. 7, there is shown a diagram illustrating a schematic of an exemplary implementation of the combination switch 505, according to a preferred embodiment of the present invention. The exemplary implementation of the combination switch 505 makes use of both PMOS and NMOS transistors in the implementation of the inverting buffers 615, 617, 620, and 622. Due to transistor sizing requirements and fabrication constraints, a pair of PMOS transistors 705 and 710 is used to implement the header switch 610, while a single PMOS transistor is used to implement the pre-charge switch 605. As shown in FIG. 7, the header switch 610 can be made from a pair of PMOS transistors with a total of sixteen (16) fingers at 4.3 um (transistor 705) and four (4) fingers at 3.93 um (transistor 710), while the pre-charge switch 605 can be made from a single PMOS transistor with a single finger at 0.4 um. Clearly, the header switch 610 is significantly larger than the pre-charge switch 605. Note that different transistor sizing requirements and fabrication constraints may lead to the use of a different number of transistors to implement the pre-charge switch 605 and the header switch 610. Since the inverting buffers 615, 617, 620, and 622 do not need to provide significant current, minimally sized transistors can be used in their implementation. The design (and number) of the inverting buffers 615, 617, 620, and 622 may not need to change unless a different propagation delay is desired.

Figure 8:
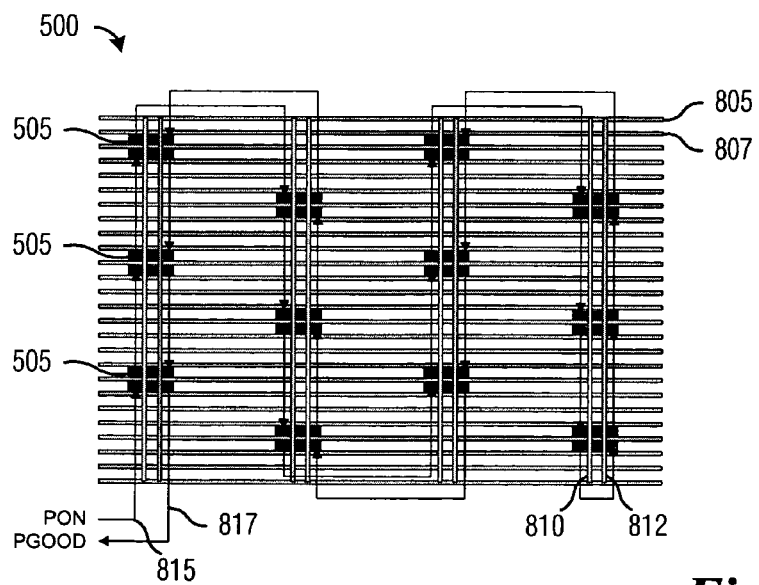
FIG. 8 is a diagram of a layout of an exemplary distributed header switch, according to a preferred embodiment of the present invention.

With reference now to FIG. 8, there is shown a diagram illustrating a layout of an exemplary distributed header switch 500, according to a preferred embodiment of the present invention. As discussed previously, the design of the distributed header switch 500 can be readily scaled by adding or removing combination switches 505 as needed, based upon a need to provide desired current and transient current suppression. FIG. 8 illustrates a layout of an exemplary distributed header switch 500 containing twelve (12) combination switches 505. Note that the combination switches 505 are arranged in four columns of three and that they are staggered to simplify routing of the control signals (PONIN, PONOUT, PGOODIN, and PGOODOUT). Horizontal lines 805 and 807 represent conductors fabricated in a metal_1 layer and vertical lines 810 and 812 represent conductors fabricated in a metal_2 layer. Conductors 815 and 817 carry the control signals need to control the state of the pre-charge switches and the header switches and at a first combination switch, the conductors can be labeled "PON" and "PGOOD."

Figure 9A:
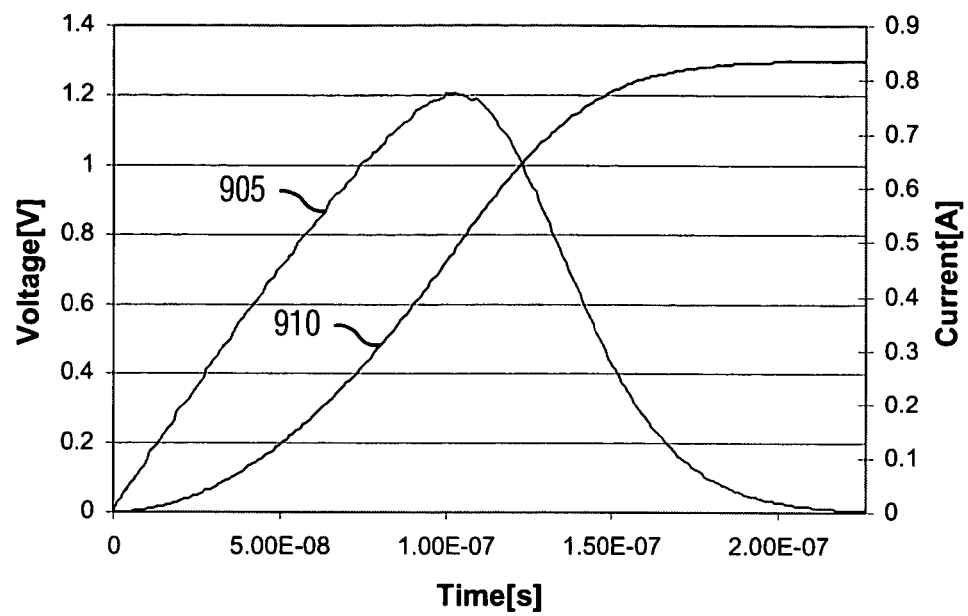
FIGS. 9a through 9d are data plots of simulation studies of the performance of an exemplary distributed header switch, according to a preferred embodiment of the present invention.

With reference now to FIG. 9a, there is shown a data plot illustrating current and voltage ramp-up across a distributed switch. Simulation studies using typical transistor models for a distributed switch with five-thousand header switches in the distributed switch and driving a circuit with a total circuitry area of 10 mm$^2$ are made and the results are shown in FIG. 9a. A first curve 905 illustrates current across the distributed switch as a function of time and a second curve 910 illustrates voltage across the distributed switch as a function of time. At time zero (0), the header switches are closed in sequential fashion. As the header switches are closed, the current across the distributed switch (the first curve 905) begins to ramp up and at approximately 100 ns, a peak current of 780 milli-amps is seen. Clearly, a peak current of 780 milli-amps can be damaging to delicate circuitry. As the current ramps up, the voltage (the second curve 910) also ramps up. At approximately 100 ns, when all of the header switches have been closed, the voltage begins to level off. As the voltage begins to level off, the current across the distributed switch begins to drop, due to the smaller voltage difference. Finally, at approximately 160 ns, when the voltage approaches its steady state value of 1.3 volts, the current across the distributed switch begins to approach zero (0) amps.

Figure 9B:
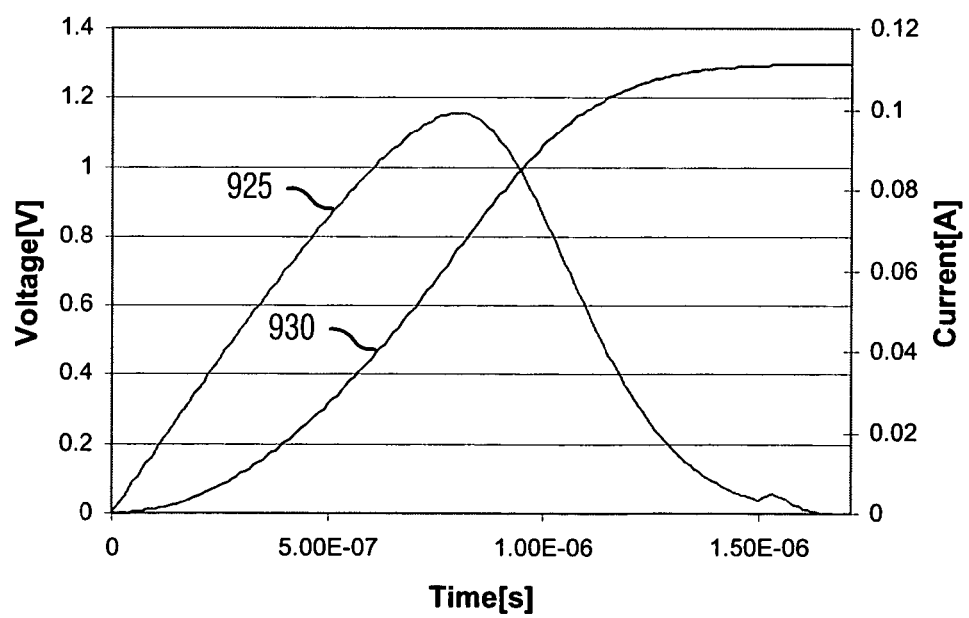

With reference now to FIG. 9b, there is shown a data plot illustrating current and voltage ramp-up across a distributed switch with pre-charge switches, according to a preferred embodiment of the present invention. Once again, simulation studies using typical transistor models for a distributed switch with pre-charge switches with five-thousand combination switches and driving a circuit with a total circuitry area of 10 mm$^2$ are made and the results are shown in FIG. 9b. A third curve 925 illustrates current across the distributed switch and a fourth curve 930 illustrates voltage levels at the distributed switch, both as a function of time. The third curve 925 shows that at approximately 750 ns, a peak current of 100 milli-amps is seen across the distributed switch and then at approximately 1500 ns, a small second current peak can be observed. The small second current peak is due to the turning on of the header switches in the combination switches. The general behavior of the current (the third curve 925) is similar to the current in the simulation studies of the distributed switch without pre-charge switches (shown in FIG. 9a), however, the peak current occurs at a later time (approximately 750 ns instead of 100 ns) and with a smaller magnitude (approximately 100 milli-amps instead of 780 milli-amps). The peak current seen in the distributed switch with pre-charge switches is only about 12% of the peak current seen in the distributed switch without pre-charge switches. Therefore, damage to delicate circuitry is much less likely. Furthermore, once the header switches have all been closed, a second current peak is seen, but its magnitude is less than 10 milli-amps.

Figure 9C:
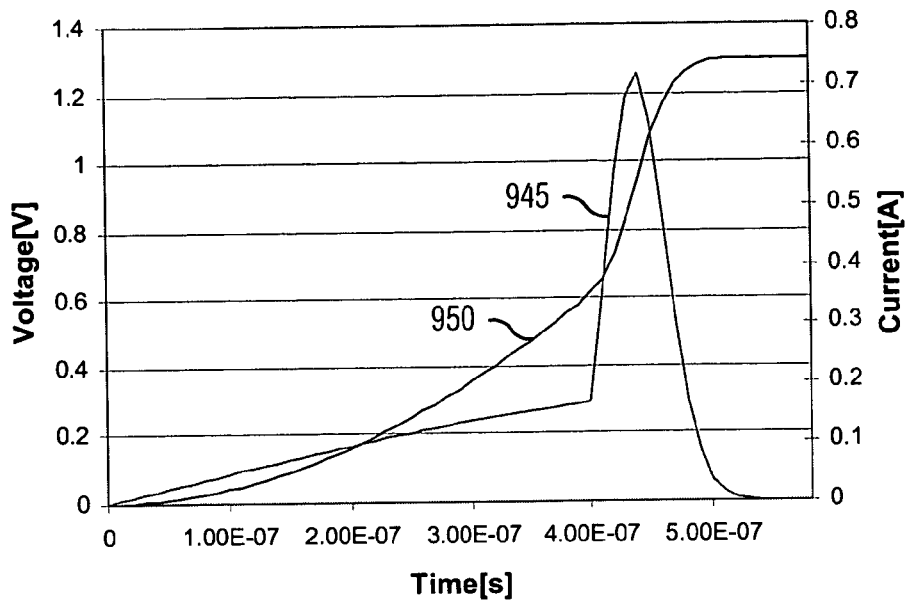

With reference now to FIG. 9c, there is shown a data plot illustrating current and voltage ramp-up across a distributed switch with pre-charge switches, wherein the number of pre-charge switches is smaller than necessary, according to a preferred embodiment of the present invention. As before, simulation studies using typical transistor models for a distributed switch with pre-charge switches with two-thousand combination switches and driving a circuit with a total circuitry area of 10 mm$^2$ are made and the results are shown in FIG. 9c. However, two-thousand combination switches are shown to be an insufficient number. A fifth curve 945 illustrates current across the distributed switch and a sixth curve 950 illustrates voltage levels at the distributed switch, both as a function of time. The fifth curve 945 shows that at approximately 400 ns, a linearly rising current rapidly shoots up from 200 milli-amps to over 700 milli-amps. The rapid change in the current is due to the header switches being closed prior to the voltage at the distributed switch reaching a safe level. Close examination of the voltage at the distributed switch (the sixth curve 950) shows that the voltage slowly ramps up until approximately 400 ns and then the ramp up rate increases dramatically. This behavior is due to an inadequate number of combination switches not allowing the voltage at the distributed switch to reach the safe level before the header switches are closed.

Figure 9D:
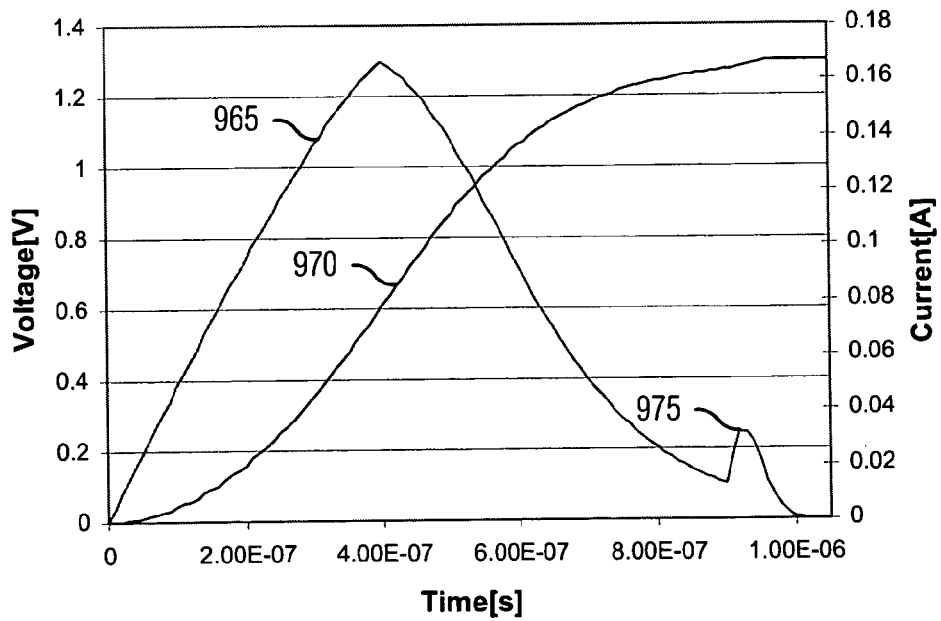

With reference now to FIG. 9d, there is shown a data plot illustrating current and voltage ramp-up across a distributed switch with pre-charge switches, wherein the number of pre-charge switches is smaller than necessary, however, a delay is implemented prior to turning on header switches, according to a preferred embodiment of the present invention. As before, simulation studies using typical transistor models for a distributed switch with pre-charge switches with two-thousand combination switches and driving a circuit with a total circuitry area of 10 mm$^2$ are made and the results are shown in FIG. 9d. However, two-thousand combination switches are shown to be an insufficient number, but the distributed switch includes a delay of 500 ns before the header switches are closed. A seventh curve 965 illustrates current across the distributed switch and an eighth curve 970 illustrates voltage levels at the distributed switch, both as a function of time. The simulation study shown in FIG. 9d uses a distributed switch with the same number of combination switches as the simulation study used in FIG. 9c. However, a delay of 500 ns is implemented after the pre-charge switches have all been closed and before the header switches are closed. The delay permits the voltage at the distributed switch to continue to rise and the current across the distributed switch to drop before the header switches are closed. At approximately 900 ns, a small current peak 975 can be seen when the header switches are closed. However, since the voltage at the distributed switch is close the final voltage level, the magnitude of the small current peak 975 is small, approximately 35 milli-amps.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A combination switch comprising:
   a pre-charge switch having a first source/drain terminal coupled to a power supply and a second source/drain terminal coupled to a power output terminal, wherein the pre-charge switch is configured to selectively couple the power supply to the power output terminal;
   a header switch having a first source/drain terminal coupled to the power supply and a second source/drain terminal coupled to the power output terminal, wherein the header switch is configured to selectively couple the power supply to the power output terminal, and wherein the pre-charge switch has a lower current capacity than the header switch;
   a first control signal line coupled to a gate terminal of the pre-charge switch, the first control signal line configured to carry a first control signal to control a state of the pre-charge switch, wherein the first control signal line of the combination switch is coupled to the first control signal line of a combination switch immediately preceding it in the linear sequence and the first control signal line of the combination switch is coupled to the first control signal line of a combination switch immediately following it in the linear sequence; and
   a second control signal line coupled to a gate terminal of the header switch, the second control signal line configured to carry a second control signal to control a state of the header switch, wherein the combination switch is configured so that the pre-charge switch is turned on before the header switch.

2. The combination switch of claim 1, wherein the pre-charge switch comprises a p-type metal oxide semiconductor (PMOS) transistor, wherein the header switch comprises a PMOS transistor, and wherein a sizing of the pre-charge switch is smaller than a sizing of the header switch.

3. The combination switch of claim 2, wherein the header switch comprises a plurality of PMOS transistors coupled in parallel.

4. The combination switch of claim 2, wherein the sizing of the pre-charge switch is determined to minimize current flow.

5. The combination switch of claim 1, wherein the first control signal and the second control signal are active high signals, and wherein the first control signal line is coupled to a first inverting buffer prior to being coupled to the gate terminal of the pre-charge switch and the second control signal line is coupled to a second inverting buffer prior to being coupled to the gate terminal of the header switch.

6. A combination switch comprising:
    a pre-charge switch having a first source/drain terminal coupled to a power supply and a second source/drain terminal coupled to a power output terminal, wherein the pre-charge switch is configured to selectively couple the power supply to the power output terminal;
    a header switch having a first source/drain terminal coupled to the power supply and a second source/drain terminal coupled to the power output terminal, wherein the header switch is configured to selectively couple the power supply to the power output terminal, and wherein the pre-charge switch has a lower current capacity than the header switch;
    a first control signal line coupled to a gate terminal of the pre-charge switch, the first control signal line configured to carry a first control signal to control a state of the pre-charge switch;
    a second control signal line coupled to a gate terminal of the header switch, the second control signal line configured to carry a second control signal to control a state of the header switch, wherein the combination switch is configured so that the pre-charge switch is turned on before the header switch;
    wherein the first control signal and the second control signal are active high signals, and wherein the first control signal line is coupled to a first inverting buffer prior to being coupled to the gate terminal of the pre-charge switch and the second control signal line is coupled to a second inverting buffer prior to being coupled to the gate terminal of the header switch; and
    wherein an output of the first inverting buffer is provided to a third inverting buffer and an output of the second inverting buffer is provided to a fourth inverting buffer.

7. A distributed switch comprising a linear sequence of combination switches, wherein each combination switch comprises:
    a pre-charge switch having a first source/drain terminal coupled to a power supply and a second source/drain terminal coupled to a power output terminal, wherein the pre-charge switch is configured to selectively couple the power supply to the power output terminal;
    a header switch having a first source/drain terminal coupled to the power supply and a second source/drain terminal coupled to the power output terminal, wherein the header switch is configured to selectively couple the power supply to the power output terminal;
    a first control signal line coupled to a gate terminal of the pre-charge switch, the first control signal line configured to carry a first control signal to control a state of the pre-charge switch, wherein the first control signal line of the combination switch is coupled to the first control signal line of a combination switch immediately preceding it in the linear sequence and the first control signal line of the combination switch is coupled to the first control signal line of a combination switch immediately following it in the linear sequence; and
    a second control signal line coupled to a gate terminal of the header switch, the second control signal line configured to carry a second control signal to control a state of the header switch, wherein the second control signal line of the combination switch is coupled to the second control signal line of a combination switch immediately preceding it in the linear sequence and the second control signal line of the combination switch is coupled to the second control signal line of a combination switch immediately following it in the linear sequence.

8. The distributed switch of claim 7, wherein the first control signal and the second control signal are active high signals, and wherein in each combination switch, the first control signal line is coupled to a first inverting buffer prior to being coupled to the gate terminal of the pre-charge switch and the second control signal line is coupled to a second inverting buffer prior to being coupled to the gate terminal of the header switch.

9. The distributed switch of claim 8, wherein in each combination switch, an output of the first inverting buffer is provided to a third inverting buffer and an output of the second inverting buffer is provided to a fourth inverting buffer, and wherein an output of the third inverting buffer is coupled to the first control signal line of a combination switch immediately following it in the linear sequence and an output of the fourth inverting buffer is coupled to the second control signal line of a combination switch immediately preceding it in the linear sequence.

10. The distributed switch of claim 7, wherein the distributed switch is used to provide power to circuitry in an integrated circuit, and wherein at a first combination switch of the linear sequence, the first control signal line is used to initiate a power on sequence for the pre-charge switches and the header switches in the linear sequence and the second control signal line is used to indicate that the circuitry has been powered up.

11. The distributed switch of claim 7, wherein at a last combination switch of the linear sequence, the first control signal line is coupled to the second control signal line.

12. The distributed switch of claim 7 further comprising a delay element having an input coupled to a first control signal line of a last combination switch of the linear sequence and an output coupled to a second control signal line of the last combination switch of the linear sequence, the delay element is configured to impart a specified delay on a signal provided at the input.

13. The distributed switch of claim 12, wherein the specified delay allows a current induced by the turning on of the pre-charge switches to decrease.

14. The distributed switch of claim 7, wherein a number of combination switches in the linear sequence is dependent upon a capacitance load model of a load that the distributed switch is driving.

15. The distributed switch of claim 14, wherein each pre-charge switch can drive a certain capacitive load, and wherein the number of combination switches is substantially equal to the load divided by the certain capacitive load.

16. The distributed switch of claim 7, wherein a number of combination switches in the linear sequence is dependent upon a current requirement of a load that the distributed switch is driving.

17. The distributed switch of claim 7, wherein the distributed switch is coupled between the power supply and a circuit, wherein the circuit is coupled to the power output terminal, and wherein the distributed switch enables a turning on of the circuit without inducing a transient current with a magnitude that can cause damage to the circuit.

18. The distributed switch of claim 17, wherein the power supply, the distributed switch, and the circuit are part of an integrated circuit.

19. A method for providing power to circuitry in an integrated circuit, the method comprising:
    turning on a series of low-current switches in a sequential fashion, wherein each low-current switch couples the circuitry to a power supply and each low-current switch comprises a transistor with a first size; and turning on a series of high-current switches in a sequential fashion, wherein each high-current switch couples the circuitry to the power supply and each high-current switch comprises a transistor with a second size, wherein the second size is larger than the first size, and wherein the number of low-current switches in the series is equal to the number of high-current switches in the series.

20. The method of claim 19 further comprising after the first turning, waiting a specified amount of time.

21. The method of claim 19 further comprising after the second turning, enabling the circuitry to begin operations.

22. The method of claim 19, wherein there is a first delay between turning on consecutive low-current switches and there is a second delay between turning on consecutive high-current switches.

23. The method of claim 22 wherein the first delay is substantially equal to the second delay.

24. The method of claim 22 wherein the first delay is different from the second delay.

25. The method of claim 19 wherein the low-current switches and the high-current switches are made from p-type metal oxide semiconductor (PMOS) transistors.

26. The method of claim 19, wherein the second size is 10 to 1000 times larger than the first size.

27. A combination switch comprising:

a pre-charge switch having a first source/drain terminal coupled to a power supply and a second source/drain terminal coupled to a power output terminal, wherein the pre-charge switch is configured to selectively couple the power supply to the power output terminal;

a header switch having a first source/drain terminal coupled to the power supply and a second source/drain terminal coupled to the power output terminal, wherein the header switch is configured to selectively couple the power supply to the power output terminal, and wherein the pre-charge switch has a lower current capacity than the header switch;

a first control signal line coupled to a gate terminal of the pre-charge switch, the first control signal line configured to carry a first control signal to control a state of the pre-charge switch; and a second control signal line coupled to a gate terminal of the header switch, the second control signal line configured to carry a second control signal to control a state of the header switch, wherein the combination switch is configured so that the pre-charge switch is turned on before the header switch, wherein the second control signal line of the combination switch is coupled to the second control signal line of a combination switch immediately preceding it in the linear sequence and the second control signal line of the combination switch is coupled to the second control signal line of a combination switch immediately following it in the linear sequence.

* * * * *